US006711013B2

(12) United States Patent
Wobig et al.

(10) Patent No.: US 6,711,013 B2
(45) Date of Patent: Mar. 23, 2004

(54) ACTIVE HEAT SINK UTILIZING HOT PLUG FANS

(75) Inventors: Eric Wobig, Austin, TX (US); Alex Z. Rodriguez, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/128,160

(22) Filed: Apr. 23, 2002

(65) Prior Publication Data

US 2003/0198016 A1 Oct. 23, 2003

(51) Int. Cl.[7] .................................................. G06F 1/20
(52) U.S. Cl. ........................ 361/687; 361/695; 439/247; 454/184
(58) Field of Search ................................ 361/680–687, 361/724–727, 695–697; 439/247, 248; 454/184; 165/104.33

(56) References Cited

U.S. PATENT DOCUMENTS

| 5,331,507 | A | | 7/1994 | Kyung et al. ................ 361/704 |
| 5,448,449 | A | | 9/1995 | Bright et al. ................ 361/704 |
| 5,600,540 | A | | 2/1997 | Blomquist .................... 361/704 |
| 6,181,553 | B1 | * | 1/2001 | Cipolla et al. ............... 361/687 |
| 6,297,957 | B1 | * | 10/2001 | Johnson et al. .............. 361/687 |
| 6,421,239 | B1 | * | 7/2002 | Huang ......................... 361/696 |
| 6,435,889 | B1 | * | 8/2002 | Vinson et al. ............... 439/427 |
| 2003/0056941 | A1 | * | 3/2003 | Lai et al. ................ 165/104.33 |

* cited by examiner

Primary Examiner—Hung Van Duong
(74) Attorney, Agent, or Firm—Haynes and Boone, LLP (57) ABSTRACT

A heat sink is mounted on a chassis and a fan support is mounted for movement adjacent the heat sink member. A fan is mounted in the fan support. A first connector is connected to the fan. A second connector is connected to the chassis for aligned mating connection with the first connector. When the fan support is moved toward the chassis, the fan and first connector are moved to connect with the second connector.

19 Claims, 7 Drawing Sheets

ACTIVE HEAT SINK UTILIZING HOT PLUG FANS

BACKGROUND

The disclosures herein relate generally to computer systems and more particularly to cooling a computer with an active heat sink including a hot plug fan.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Processor power levels are rising rapidly. Latest generation chips are already providing very difficult thermal challenges. The amount of money spent per unit on an adequate thermal solution continues to increase to meet these power demands.

One of the easiest and economical ways to make a highly efficient cooling system is to use an active heat sink, i.e. a heat sink with a fan blowing/drawing air directly through the heat sink fins. The major drawback of this approach is that if the heat sink fan fails you have to shut down the system and replace the whole heat sink. Fans are one of the major failure modes in a system, so having to shutdown every time one fails is very undesirable.

Hot plug fans, i.e. being able to swap a failed fan while the system is still running, is a very advantageous component to have on an information handling system such as a server. It's always at the top of the "wish list" from a marketing position.

Systems have used active heat sinks for years. However, in these cases the fans were attached to the heat sink in such a way that the heat sink had to be replaced if the fan failed. Replacing a heat sink means shutting down the system, which equates to server down time.

Therefore, what is needed is a computer cooling system that includes an active heat sink utilizing a hot plug fan.

SUMMARY

One embodiment, accordingly, provides an active heat sink apparatus including a heat sink member and a fan support adjacent the heat sink member. A fan is mounted on the fan support. A first connector is connected to the fan and a second connector is adjacent the heat sink member for providing a mating connection with the first connector.

A principal advantage of this embodiment is that the computer system has the benefits of an active heat sink and the fans are hot plug fans.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
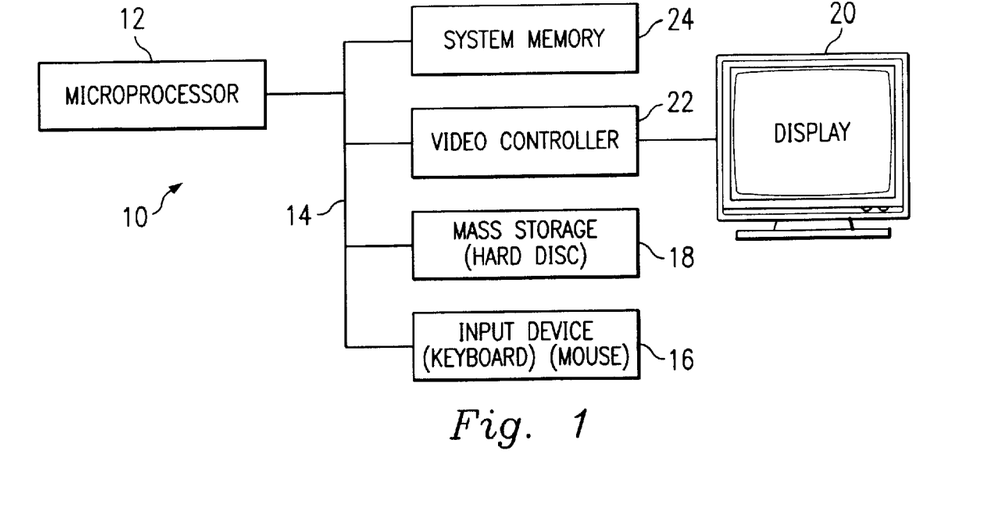
FIG. 1 is a diagrammatic view illustrating an embodiment of a computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
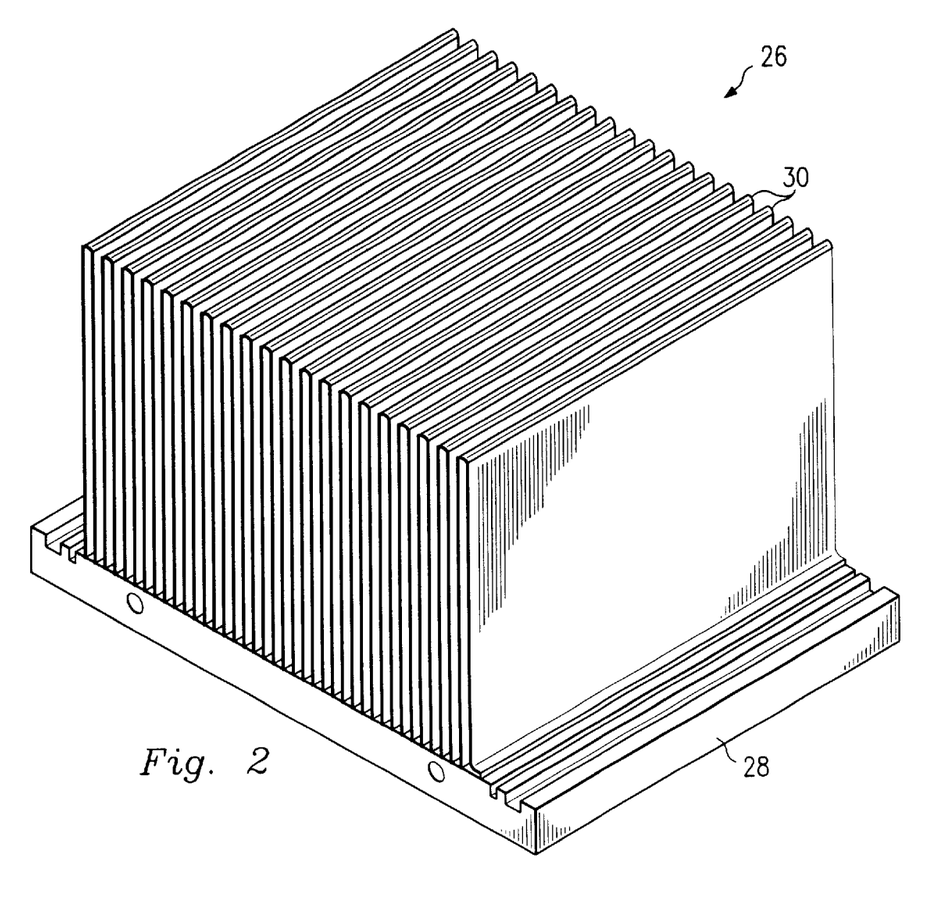
FIG. 2 is a perspective view illustrating an embodiment of a heat sink.
Figure 3:
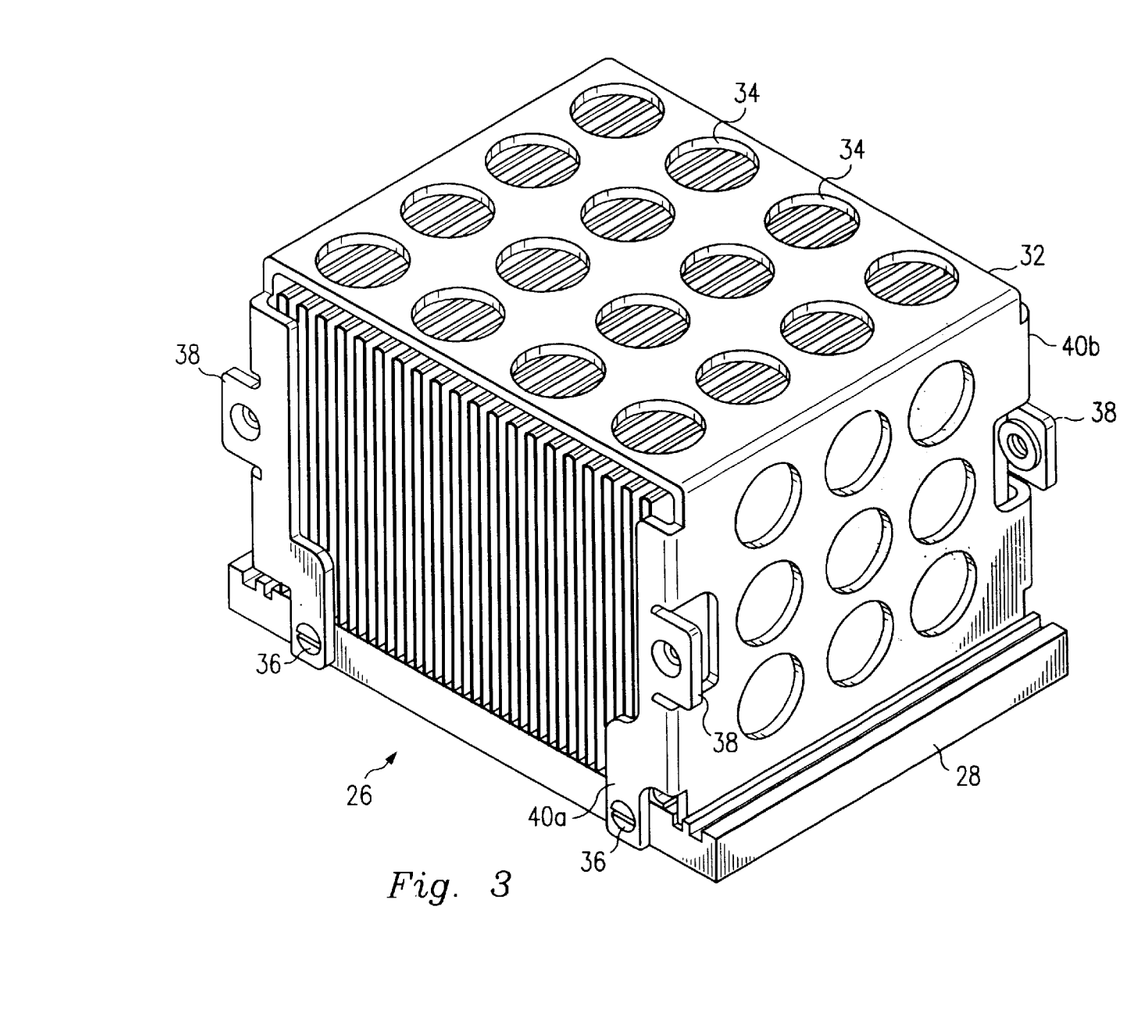
FIG. 3 is a perspective view illustrating an embodiment of the heat sink in a housing.

A heat sink member 26, FIG. 2, includes a base 28 and a plurality of enlarged fins 30 extending from the base 28. A housing 32, FIG. 3, is provided for mounting on heat sink member 26. Housing 32 includes a plurality of vent openings 34 formed therein. Housing 32 is attached to base 28 by a plurality of fasteners 36. A plurality of tabs 38 are provided to extend from opposite sides 40a and 40b of housing 32.

Figure 4:
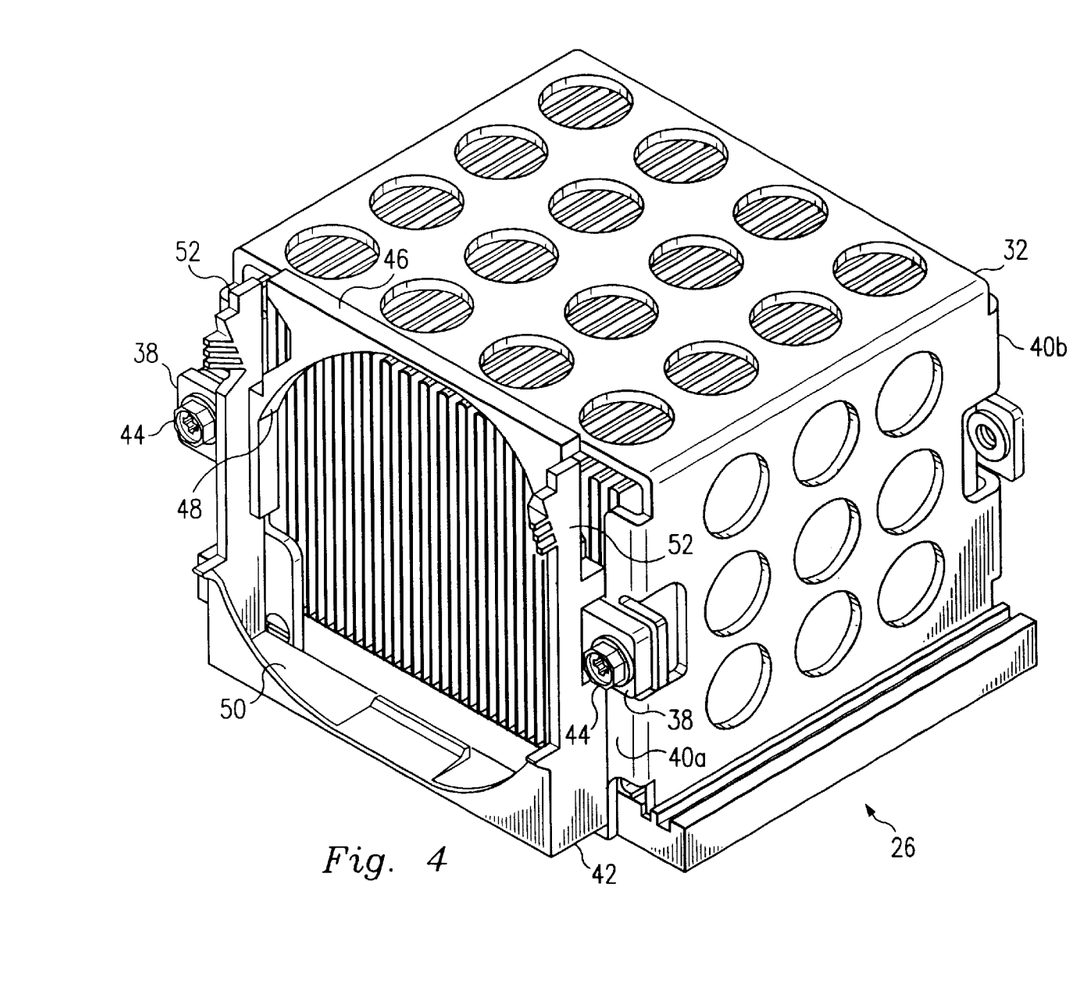
FIG. 4 is a perspective view illustrating an embodiment of a fan guide attached to the housing.

A fan guide 42, FIG. 4, is mounted adjacent heat sink 26 and is in fact attached to housing 32 by means of fasteners 44 which attach to the tabs 38. Because of the plurality of tabs 38, fan guide 42 can be attached to either side 40a or 40b of housing 32. Fan guide 42 includes a plate 46 including an opening 48 formed therein, a pocket 50, and a pair of opposed flexible arms 52 which extend from pocket 50 adjacent plate 46.

Figure 5:
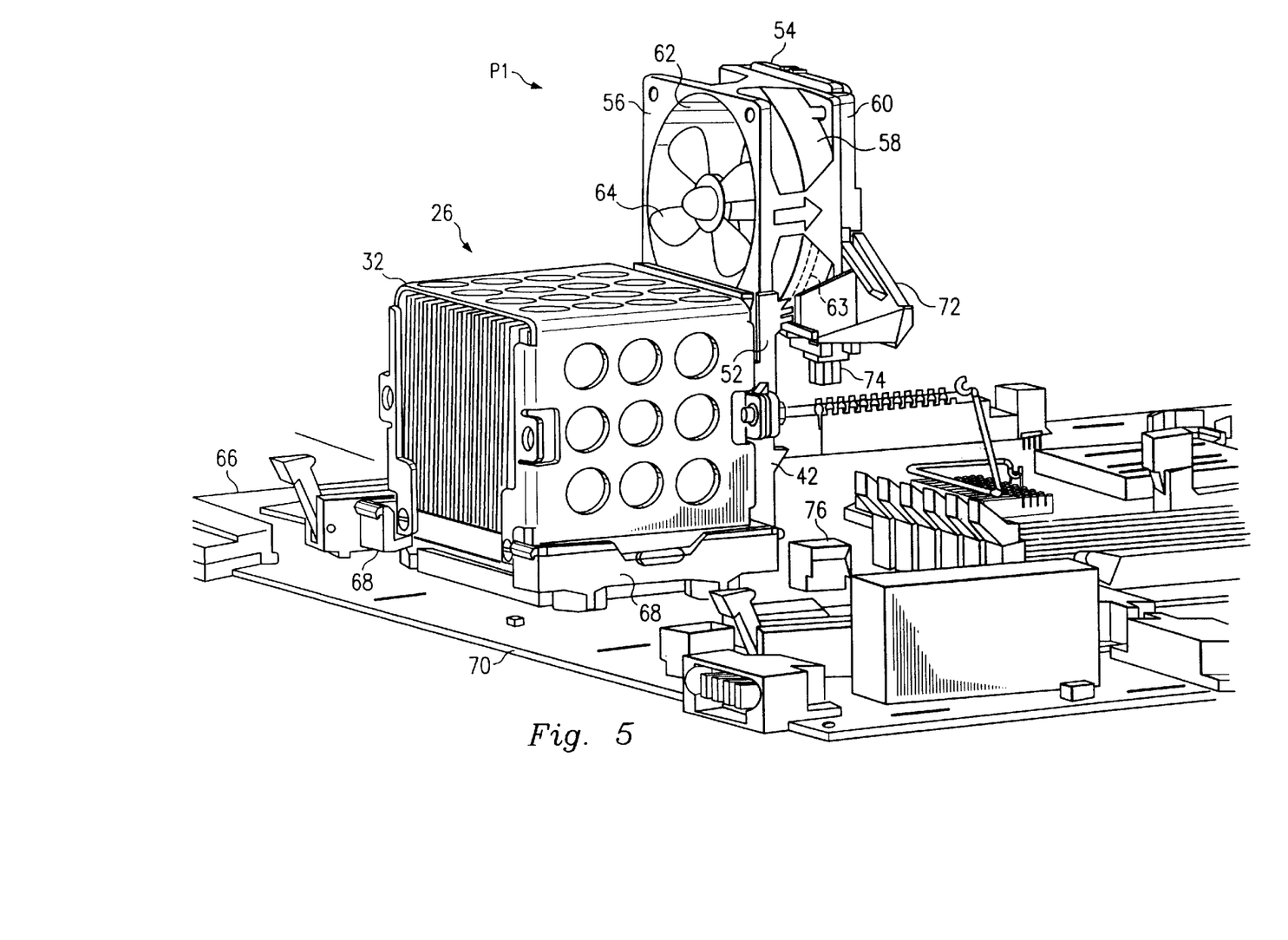
FIG. 5 is a perspective view illustrating an embodiment of a computer including a fan support mounted on the fan guide.
Figure 6:
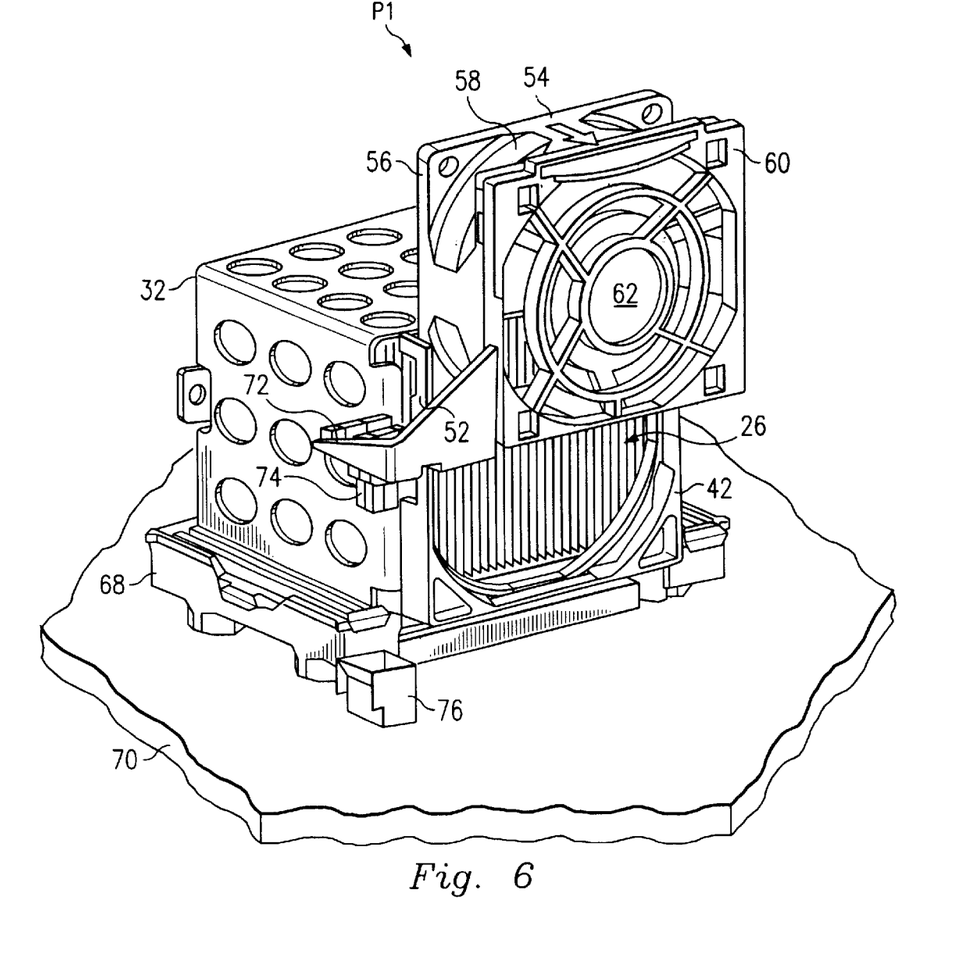
FIG. 6 is another perspective view illustrating the fan support.

A fan assembly includes a fan support 54, a fan 64, and a male connector 74. The fan support 54, FIGS. 5 and 6, is provided to include a slide plate 56, a shroud 58 and a guard plate 60. An opening 62 is defined by shroud 58. The fan 64 is mounted in fan support 54. Slide plate 56 is received in sliding engagement with flexible arms 52 so that fan support 54 is movably and slidably mounted on housing 32 by means of guide 42.

Also in FIG. 5, heat sink member 26 is mounted in a computer chassis 66 of computer system 10 by means of a heat sink support 68 mounted on, for example, a motherboard 70. A connector arm 72 extends from fan support 54 and includes the male connector 74 which is electrically hard-wired at 63 to fan 64. A female connector 76 is mounted on and electrically connected to motherboard 70 and is positioned in alignment for receiving and forming a mating connection with connector 74.

Figure 7:
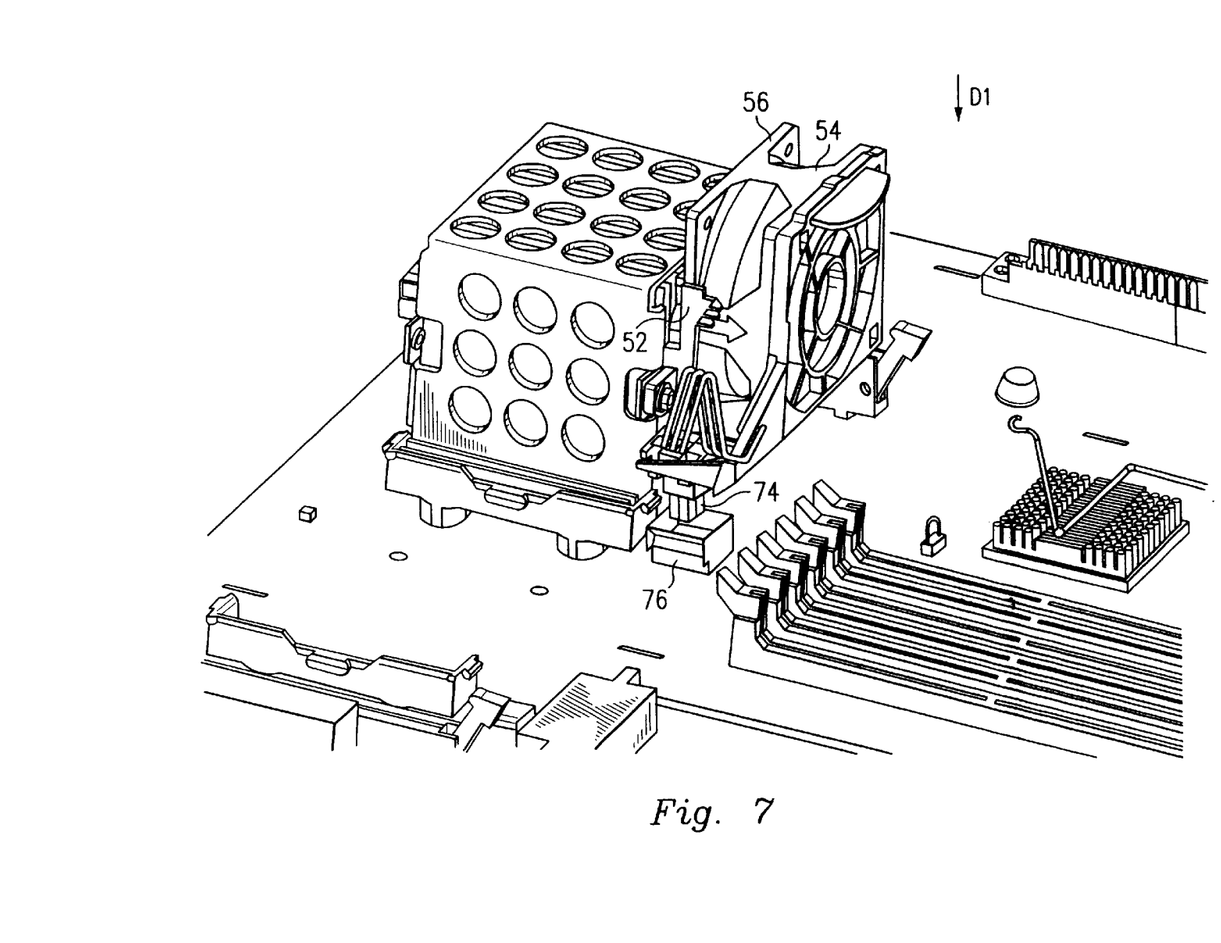
FIG. 7 is a further perspective view illustrating the fan support.
Figure 8:
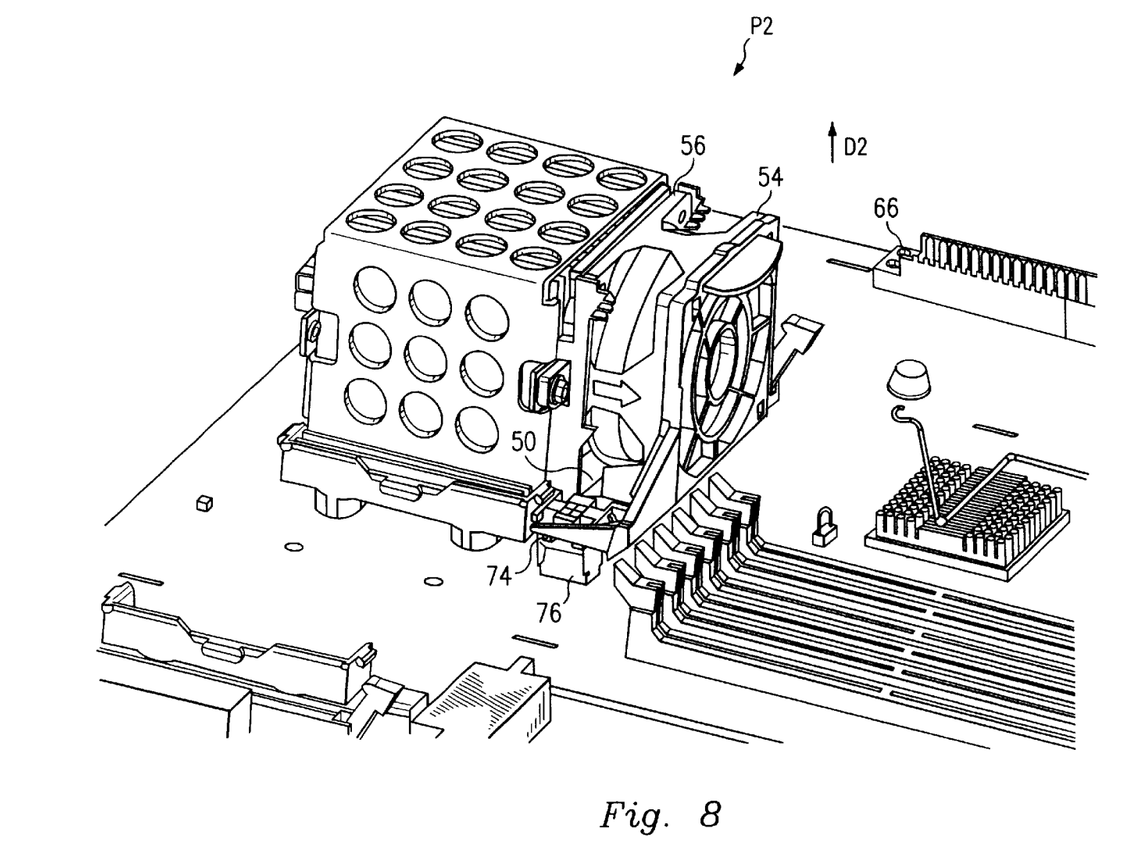
FIG. 8 is a still further perspective view illustrating the fan support.

In operation, fan support 54 is in a first position P1 in FIGS. 5 and 6 with slide plate 56 engaged with arms 52. Support 54 is moved along arms 52 in a direction D1, FIG. 7, so that connector 74 is urged toward connector 76. When fan support 54 FIG. 8, is fully seated in a second position P2, i.e., slide plate 56 is seated in pocket 50, the connector 74 is engaged with connector 76 and fan 64 is plugged into chassis 66. Fan support 54 is removed by being urged in a direction D2, opposite the direction D1.

Rather than permanently affixing the fan to the heat sink, the fan slides into a holder mounted directly to the heat sink. A carrier on the fan holds a blind mate connector. This allows the fan to be attached directly to the heat sink, giving excellent thermal performance, but the fan support can be slid out of the fan guide and changed on the fly if it fails. This approach uses the active heat sink and hot plug fans. It provides an advantage because as CPU power levels go up, active heat sinks are one of the only ways to provide adequate cooling.

Although illustrative embodiments have been shown and described, a wide range of modification, change and substitution is contemplated in the foregoing disclosure and in some instances, some features of the embodiment may be employed without a corresponding use of other features. Accordingly, it is appropriate that the appended claims be construed broadly and in a manner consistent with the scope of the embodiments disclosed herein.

What is claimed is:

1. An active heat sink apparatus comprising:
   a heat sink housing;
   a heat sink member mounted in the housing and seated in a chassis;
   a fan guide mounted on the housing;
   a fan support including a fan, the support slidably engaged with the guide and movable to a fully seated position in the chassis;
   a first connector mounted on and movable with the fan support; and
   a second connector mounted in the chassis in alignment with the first connector, whereby moving the support to the fully seated position engages the first and second connectors.

2. The apparatus as defined in claim 1 wherein the first connector is mounted on an arm extending from the fan support in alignment with the second connector.

3. The apparatus as defined in claim 1 wherein the first connector is mounted on an arm extending from the fan support and is electrically connected to the fan.

4. The apparatus as defined in claim 1 further comprising: a base supporting the heat sink member and the housing.

5. A computer comprising:
   a chassis;
   a heat transfer member mounted in the chassis;
   a fan guide having opposed arms mounted adjacent the heat transfer member;
   a fan support slidably mounted in the arms, the support carrying a fan and a first fan connector; and
   a second fan connector connected to the chassis providing a mating connection with the first connector in response to sliding the fan support to a seated position with the fan guide.

6. The computer as defined in claim 5 wherein the heat transfer member is mounted in a housing.

7. The computer as defined in claim 5 wherein the first fan connector extends from the fan support.

8. The computer as defined in claim 5 wherein the first fan connector is electrically connected to the fan.

9. The computer as defined in claim 5 further comprising: a base supporting the heat transfer member and the housing.

10. An information handling system comprising:
    a chassis;
    a microprocessor mounted in the chassis;
    a storage coupled to the microprocessor;
    a heat dissipating member mounted in the chassis;
    a fan guide mounted adjacent the heat dissipating member;
    a fan support slidably engaged with the fan guide, the support including a fan and a first fan connector; and
    a second fan connector connected to the chassis providing a mating connection with the first connector in response to sliding the fan support to a seated position with the fan guide.

11. The system as defined in claim 10 wherein the heat dissipating member is mounted in a housing.

12. The system as defined in claim 11 wherein the fan support is attached to the housing.

13. The system as defined in claim 11 wherein the fan support is slidably mounted on the housing.

14. The system as defined in claim 11 further comprising: a base supporting the heat dissipating member and the housing.

15. The system as defined in claim 13 wherein the first fan connector is mounted on an arm extending from the fan support.

16. The system as defined in claim 13 wherein the first fan connector is electrically connected to the fan.

17. A method of providing a hot plug fan comprising:
    providing a chassis;
    mounting a heat transfer member on the chassis;
    providing guide arms adjacent the heat transfer member;
    mounting a movable fan support in the guide arms, the fan support including a fan and a first fan connector;
    mounting a second fan connector to the chassis for aligned mating connection with the first fan connector in response to the fan support being moved to a fully seated position with the guide arms.

18. The method as defined in claim 17 further comprising: providing a housing attached to the heat transfer member; and connecting a fan guide to the housing for receiving the movable fan support.

19. An active heat transfer apparatus comprising:

a heat transfer member;

a fan guide member adjacent the heat transfer member;

a fan assembly movably mounted on elongated guide arms in the fan guide member;

a first connector extending from the fan assembly; and a second connector adjacent the heat transfer member providing a mating connection with the first connector in response to the fan assembly being moved along the arms to a seated position with the fan guide member.

* * * * *